United States Patent [19]

Jahns

[11] Patent Number: 4,777,578

[45] Date of Patent: Oct. 11, 1988

[54] INTEGRATED CURRENT SENSOR TORQUE CONTROL FOR AC MOTOR DRIVES

[75] Inventor: Thomas M. Jahns, Schenectady, N.Y.

[73] Assignee: General Electric Company, Schenectady, N.Y.

[21] Appl. No.: 140,685

[22] Filed: Jan. 4, 1988

[51] Int. Cl.[4] ......................................... H02M 7/5387
[52] U.S. Cl. ...................................... 363/98; 363/132
[58] Field of Search ......................... 363/17, 25, 26, 98, 363/132, 134

[56] References Cited

U.S. PATENT DOCUMENTS

| | | | |
|---|---|---|---|
| 3,870,943 | 3/1975 | Weischrdel et al. | 363/26 |
| 4,126,819 | 11/1978 | Stobbe et al. | 363/132 |
| 4,233,658 | 11/1980 | Lupatin et al. | 363/134 |
| 4,351,020 | 9/1982 | Leti et al. | 363/26 |
| 4,533,836 | 8/1985 | Carpentar et al. | 363/17 |
| 4,710,686 | 12/1987 | Gvzik | 363/98 |

OTHER PUBLICATIONS

D. M. Brod et al., "Current Control of VSI-PWM Inverters", IEEE Trans. on Industry Applications, vol. IA-21, pp. 562-570, May/Jun. 1985.
C-E. Cordonnier and D. L. Zaremba, Jr., "Application Considerations for SENSEFET TM Power MOSFET Devices", Power Conversion International Conference Proceedings, May 1987, pp. 47-65.
W. Schultz, "Lossless Current Sensing with SENSE-FETs Enhances Motor Drive Design:, Power Conversion and Intelligent Motion, Apr. 1986, pp. 30-34.
S. Young, "Current Sensing HEX Sense Power MOS-FETs Simplify SMPS Designs and Lower Losses;, Power Conversion and Intelligent Motion, Jul. 1987, pp. 76-83.

Primary Examiner—Patrick R. Salce
Assistant Examiner—J. Sterrett
Attorney, Agent, or Firm—Marvin Snyder; James C. Davis, Jr.

[57] ABSTRACT

A method and apparatus for operating a current-controlled pulse width modulated inverter for driving a polyphase AC load includes using partial current feedback information, obtained from the inverter lower phase-leg switches and flyback diodes only, to regulate current flow in each phase of the load by synthesizing an analog feedback signal from the partial current feedback information.

15 Claims, 5 Drawing Sheets

INTEGRATED CURRENT SENSOR TORQUE CONTROL FOR AC MOTOR DRIVES

The present invention relates in general to feedback current control of polyphase loads and more specifically to a method and apparatus for operating a current-controlled pulse width modulated (PWM) inverter for driving a polyphase alternating current (AC) motor where complete feedback current information for each phase may not be constantly available.

BACKGROUND OF THE INVENTION

Accurate current control in AC motor drives is required for high-quality torque regulation of polyphase AC motors. Such control of current in each phase winding of the motor requires that the instantaneous current levels be accurately sensed. Presently available current controlled AC drives use discrete current sensors in series with the motor phase windings to sense the instantaneous phase current levels. These current sensors must be galvanically isolated from each other, as well as from the control logic, and must reject significant common mode signals associated with the inverter switching. Alternatively, AC drives can be constructed to include current sensors integral with the inverter switches and diodes. An example of this current sensor integration is described in T. M. Jahns et al. U.S. patent application Ser. No. 140,686, filed concurrently herewith and assigned to the assignee of the present invention. The integration of current sensors into the inverter switches and diodes facilitates reduction in size and cost of AC motor drives. In addition, other disadvantages associated with discrete current sensors including maximum operating temperature and sensor output drift are reduced with the new integrated sensors, as pointed out in the aforementioned Jahns et al. application Ser. No. 140,686.

However, a significant problem must be overcome when these integrated current sensors are used to regulate the output current in a direct current-to-alternating current (DC-to-AC) inverter circuit. FIG. 1a illustrates a typical inverter phase leg comprising two power switches in series connected across DC voltage source terminals 1 and 2, with the AC output power delivered at terminal 3. Each of the two switches 4 and 5 shown in FIG. 1a comprises an insulated gate bipolar transistor (IGBT) 6 and 7, respectively, combined with a flyback diode 8 and 9, respectively. As described in the aforementioned patent application Ser. No. 140,686, IGBT 6 and diode 8 are fabricated with integrated current sensors so that an output signal proportional to the bipolar switch current $i_1$ is delivered at terminal 13. IGBT 7 and diode 9 are similarly equipped with integrated current sensors so that the associated switch current $i_2$ can be measured at terminal 11.

It is desirable in such an inverter phase to regulate the instantaneous amplitude of the phase leg output current $i_3$ which, according to Kirchoff's current law, is equal to the sum of $i_1 + (-i_2)$. Thus, it becomes necessary to combine the sensor output signals at terminals 13 and 11 in order to obtain a measurement of the complete current $i_3$ for current regulation feedback.

The difficulty in generating this measurement of current $i_3$ arises because the current sensors in switches 4 and 5 do not share the same reference node. In particular, the reference node for the $i_1$ measurement signal at terminal 13 is terminal 3, which switches between the positive and negative DC bus voltages at terminals 1 and 2 during normal operation. Since the reference node for the $i_2$ measurement signal at terminal 11 is terminal 2, a large common-mode voltage difference exists between the $i_1$ and $i_2$ current measurement signals. This requires added instrumentation for level-shifting one of the signals to share the same reference voltage of the other sensor signal so that they can be combined to provide a single measurement of current $i_3$ for current regulation purposes.

The necessity for coping with common-mode signals can be avoided by constructing an AC drive in which only the inverter phase-leg lower switches and diodes (i.e., those switches and diodes connected to the inverter negative DC input bus) contain integrated current sensors. Such a configuration, while avoiding the common-mode signal conditioning problem, results in current regulation being more difficult since complete feedback current data from the inverter are no longer available. Specifically, such feedback data are missing to measure current $i_1$ when the inverter phase-leg upper switch-diode combination 4 conducts current. Thus the AC drive current controller must be able to accurately regulate motor phase currents by using current feedback information from the lower phase-leg switches and diodes only.

OBJECTS OF THE INVENTION

A primary object of the present invention is to provide a new and improved current controller for an AC motor drive which is not subject to the foregoing disadvantages.

An additional object of the invention is to provide a new and improved current controller for an AC motor drive in which the common-mode signal conditioning difficulties associated with conventional integrated sensor current controllers are obviated.

A further object of the invention is to provide a new and improved AC motor drive which uses only feedback current information obtained from current sensors integral with the inverter phase-leg lower switches and diodes to regulate operation of the drive.

Summary of the Invention

In accordance with the present invention, an AC polyphase motor drive includes a current-controlled inverter having current sensors integral with the lower phase-leg semiconductor switches and diodes of the inverter, e.g. the switches and diodes connected to the inverter negative DC input bus. For each phase-leg of the inverter, an intermittent or partial analog feedback signal is obtained by combining the outputs of the current sensors associated with that particular phase-leg. This partial phase-leg feedback signal is received by a current controller which includes a sample-and-hold unit that is controlled to produce a conditioned feedback signal for that phase-leg. The current controller is responsive to a comparison between the conditioned feedback signal and an externally derived current command signal to operate the switches associated with the particular phase-leg.

The foregoing and other objects of the present invention, together with the features and advantages thereof, will become apparent from the following detailed specification with reference to the accompanying drawings in which applicable reference numerals have been carried forward.

DETAILED DESCRIPTION OF THE INVENTION

Figure 1:
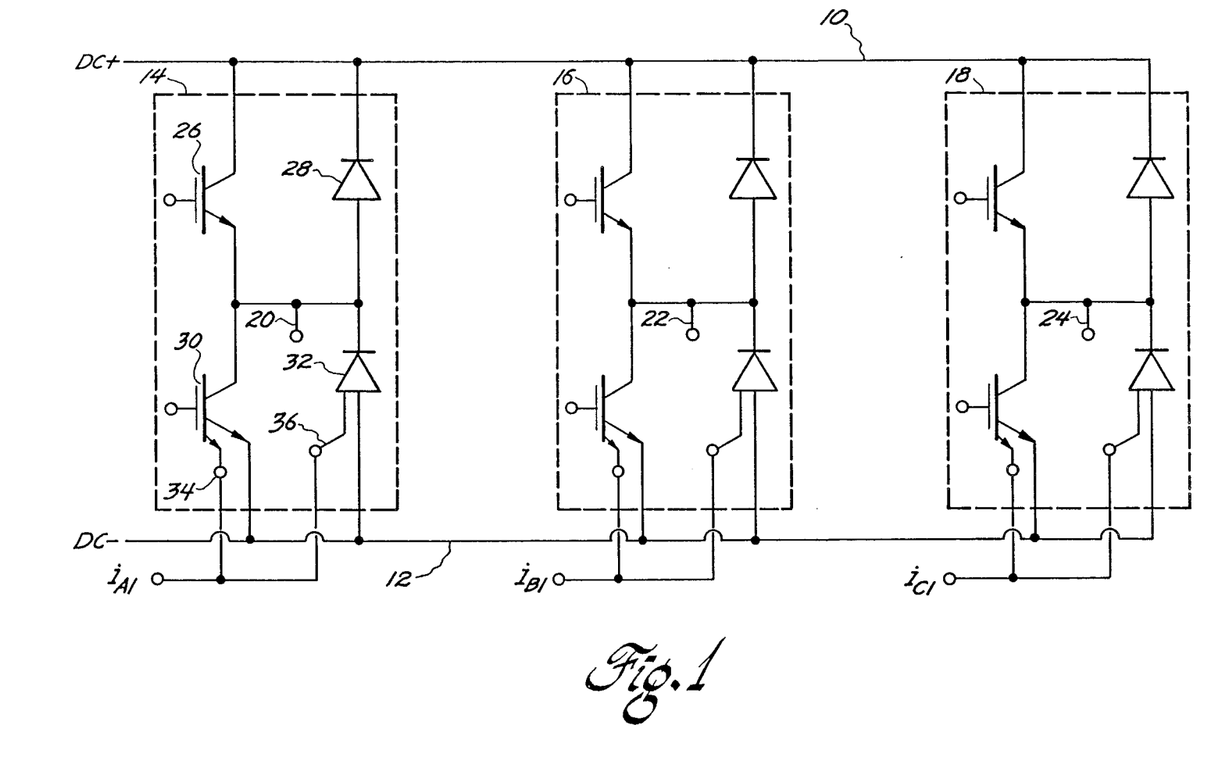
FIG. 1 is a schematic diagram of a three-phase, full-wave bridge inverter including current sensors integral with the lower phase-leg switches and diodes.
Figure 1A:
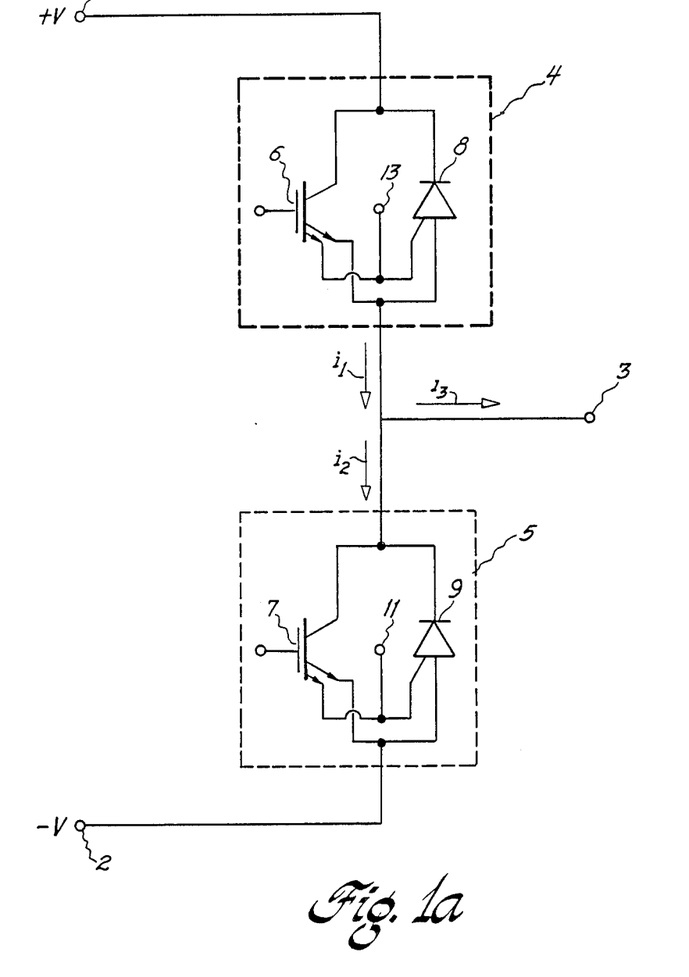
FIG. 1a is a schematic diagram of one phase leg in a DC-to-AC inverter circuit including current sensors integral with both the upper and lower phase-leg switches and diodes.

FIG. 1 illustrates a representative three-phase, full-wave bridge inverter for supplying AC stator current to an induction motor or a synchronous motor. The inverter includes three substantially identical phase-legs 14, 16 and 18 connected between positive and negative DC input buses 10 and 12, respectively. Phase-leg 14 includes an AC output terminal 20, an insulated gate bipolar transistor (IGBT) 26 and a flyback diode 28 connected in parallel between positive DC input bus 10 and AC output terminal 20, and an insulated gate transistor 30 and a flyback diode 32 connected in parallel between AC terminal 20 and negative DC input bus 12. IGBT 30 contains an integral current sensor which provides a current signal proportional to the main current in the IGBT. Diode 32 likewise contains a current sensor integral with the diode which provides a current signal proportional to the main current in the diode. IGBT 30 and diode 32 are provided with current sensor terminals 34 and 36, respectively, for connection to feedback control circuitry (not shown in FIG. 1). The configurations of phase-legs 16 and 18 are each substantially identical to phase-leg 14. AC output terminals 20, 22 and 24 are for connection to the respective windings of a three-phase synchronous motor (not shown in FIG. 1) or a three-phase induction motor.

In operation, when a DC voltage potential is applied across DC input buses 10 and 12, IGBTs 26 and 30 are alternately switched between conducting and nonconducting states to produce an AC sinusoidal output current at terminal 20 using pulse-width modulation (PWM). Similarly, the IGBTs in phase-legs 16 and 18 are alternately operated to produce AC sinusoidal output currents at AC output terminals 22 and 24, respectively. The inverter is conventionally operated such that the AC current waveforms produced by phase-legs 16 and 18 are displaced from the AC current waveform produced by phase-leg 14 by phase angles of 120° and 240°, respectively.

In phase-leg 14, sensor currents are available at terminals 34 and 36 whenever IGBT 30 and diode 32 respectively, are conducting current. By combining the sensor currents from these two devices, a phase-leg feedback signal $i_{A1}$ for phase-leg 14 is obtained. In the same manner, feedback signals $i_{B1}$ and $i_{C1}$ for phase-legs 16 and 18, respectively, are obtained.

Figure 2:
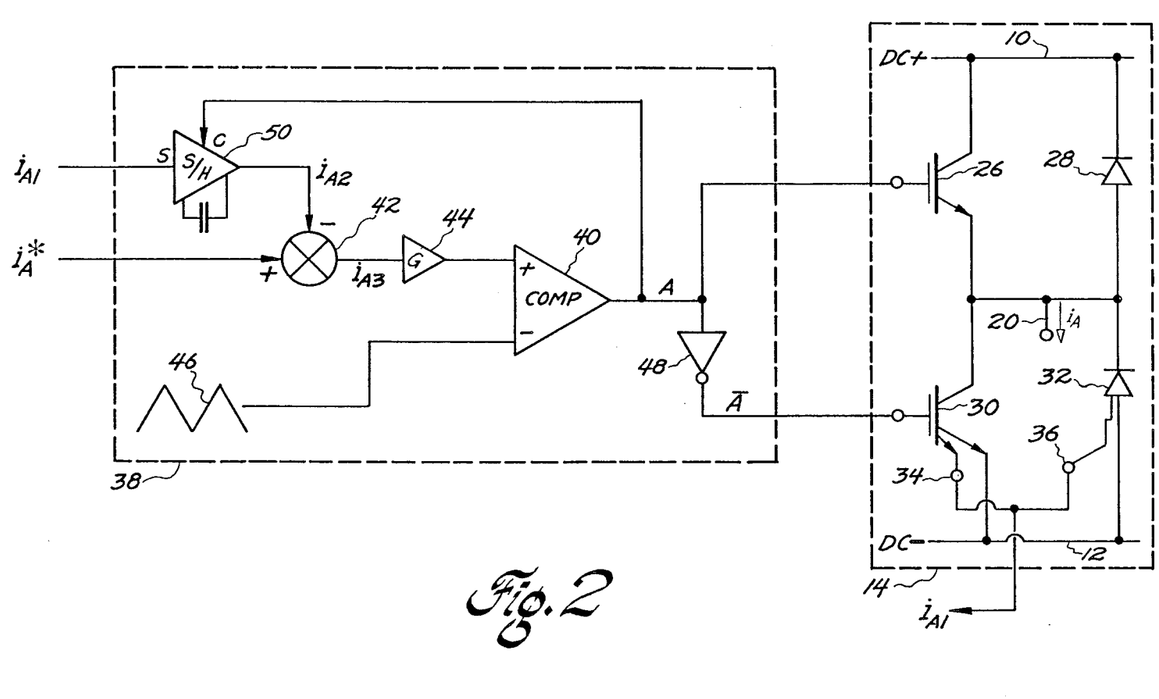
FIG. 2 is a schematic diagram of a preferred embodiment of the present invention, specifically a current controller for regulating operation of one phase-leg of the inverter of FIG. 1.

FIG. 2 illustrates a preferred embodiment of the present invention, showing a current controller 38 for regulating operation of phase-leg 14 of the above-described inverter. Current controller 38 operates IGBTs 26 and 30 in accordance with an externally derived command signal $i^*_A$ and an internally derived, synthesized signal $i_{A2}$ described below. Controller 38 includes a sample-and-hold (S/H) unit 50 which is connected to receive phase-leg feedback signal $i_{A1}$ from phase-leg 14. Controller 38 further includes subtracting means 42 connected to receive at its inputs command signal $i^*_A$ and signal $i_{A2}$ derived from S/H unit 50. An amplifier 44 is connected to receive the output signal of subtracting means 42. A comparator 40 is connected to receive as input signals the output signal of amplifier 44 and a high frequency triangular reference waveform 46. The frequency of the triangle waveform is high compared to the fundamental frequency of the output current waveform. The output of comparator 40 is connected to a control terminal of S/H unit 50, to the gate of IGBT 26, and to the gate of IGBT 30 by way of a logical inverter or NOT gate 48. It will be understood that each of phase-legs 16 and 18 (shown in FIG. 1) is operated by a controller (not shown) of configuration similar to that of controller 38 shown in FIG. 2. Conventional dead-time delay circuitry inserted at the input node of inverter gate 48 to prevent IGBTs 26 and 28 from ever turning on at the same time is omitted from FIG. 2 for simplicity.

In operation, when IGBT 30 and diode 32 conduct current, sensor currents are generated at terminals 34 and 36, respectively. As explained above, these currents are combined to produce phase-leg feedback signal $i_{A1}$ for phase-leg 14. However, this feedback signal terminates when IGBT 30 and diode 32 become nonconductive, and no feedback information is available from phase-leg 14 when either IGBT 26 or diode 28 is conducting.

The feedback current signal $i_{A1}$ from phase-leg 14 is converted into a proportional voltage by either a simple dropping resistor or an op-amp current-to-voltage converter circuit as described in the aforementioned Jahns et al. patent application Ser. No. 140,686. This current-to-voltage conversion circuitry for the integrated current sensors is not explicitly shown, for simplicity of illustration. The $i_{A1}$ signal is received at the signal input S of S/H unit 50 which passes the $i_{A1}$ signal through to the output unchanged whenever the signal received at its control terminal C is in the LOW state, i.e. whenever IGBT 30 is gated 'on'. This is the "track" state of S/H unit 50. Under such conditions, the motor phase current $i_A$ flowing at terminal 20 is being conducted either by IGBT 30 or diode 32, and, hence, being measured by their integrated current sensors. For purposes of identification, the signal so provided at the output of unit 50 is designated as a first portion of unit 50 output signal $i_{A2}$. The S/H unit captures phase-leg feedback signal $i_{A1}$ and holds it constant at its last generated value whenever a HIGH state is received at its control terminal C, i.e. whenever IGBT 30 is switched 'off' to its nonconductive state. This is the "hold" state of S/H unit 50. The signal provided at the output of unit 50 when the latter conditions obtain is referred to as a second portion of conditioned signal $i_{A2}$ and represents an estimate of the output current $i_A$ in phase-leg 14 during the interval when IGBT 30 is nonconductive. Both portions of signal $i_{A2}$ are applied to subtracting means 42.

An externally derived command signal $i^*_A$ representative of the desired output current of phase-leg 14 is applied to one input of subtracting means 42, and synthesized signal $i_{A2}$ is applied to a second input of subtracting means 42. A current error signal $i_{A3}$, equal to the difference between $i^*_A$ and $i_{A2}$, is generated by S/H unit 42 and amplified by amplifier 44. The amplified signal is compared to reference waveform 46 by comparator 40. The output signal of comparator 40, i.e. a first binary control signal, toggles between the HIGH and LOW states, being HIGH when the magnitude of current error signal $i_{A3}$ exceeds the magnitude of triangular reference waveform 46, and LOW when the magnitude of waveform 46 exceeds that of current error signal $i_{A3}$. Comparator 40 is thus controlled by a technique known in the art as ramp comparison current control. The basic concepts associated with this current control method are discussed by D. M. Brod and D. W. Novotny, "Current Control of VSI-PWM Inverters", *IEEE Transactions on Industry Applications*, Vol. IA-21, pp. 562–570, May/June 1985.

IGBT 26 is switched to its conducting state when a HIGH state signal is applied to its control gate by comparator 40. IGBT 30 is likewise placed into a conducting state when a HIGH state signal is provided to its control gate. However, NOT gate 48 connected between comparator 40 and IGBT 30 provides a second binary control signal to IGBT 30 which is the logical inverse of the first binary control signal. Therefore, IGBT 30 will be in a conducting state when IGBT 26 is in a nonconducting state, and IGBT 30 is in a nonconducting state when IGBT 26 is in a conducting state. Techniques for insuring that IGBT 30 and IGBT 26 are never conducting current at the same time are well known in the field and not discussed here.

Figure 3:
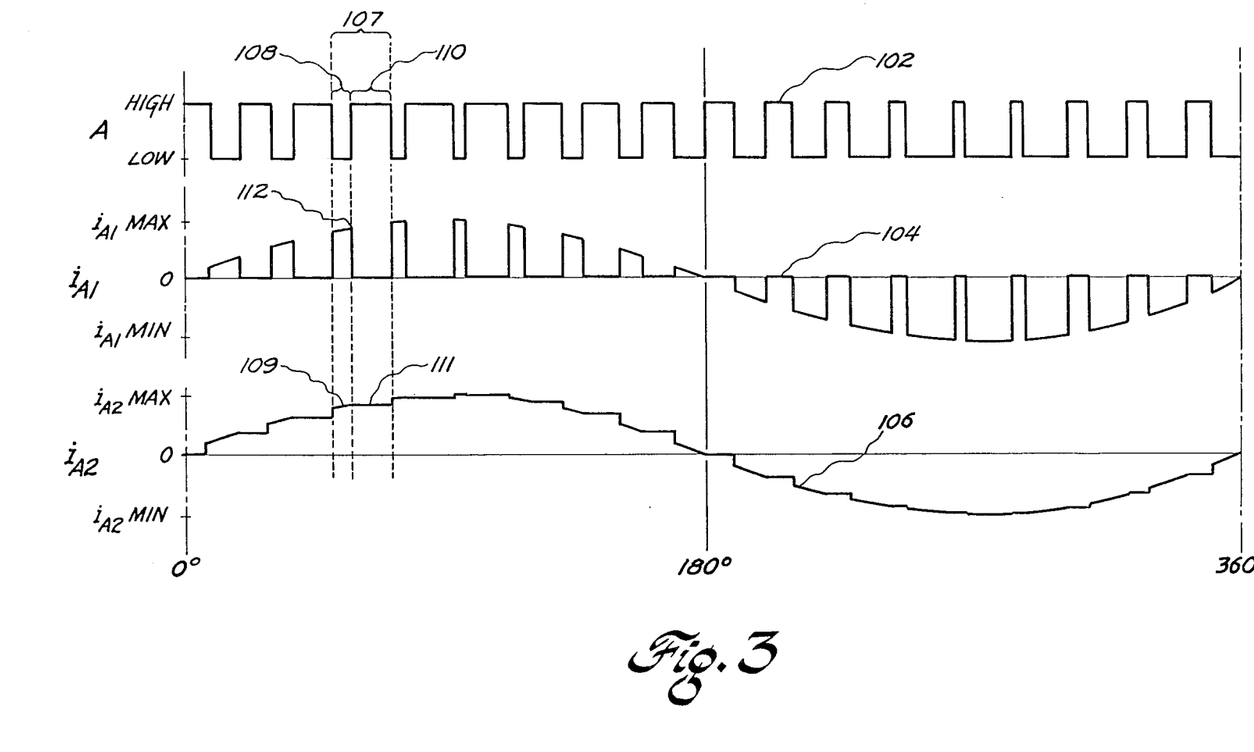
FIG. 3 illustrates signal waveforms produced at different locations in the apparatus of FIG. 2.

FIG. 3 illustrates the relationship between first binary control signal A, phase-leg feedback signal $i_{A1}$ and synthesized signal $i_{A2}$, which are represented by waveforms 102, 104 and 106, respectively. Control signal A consists of a series of pulses which vary in width and frequency of occurrence, as determined by the instantaneous operating conditions of the motor load. During the LOW state of control signal A, for example during time interval 108 of period 107, IGBT 30 is in the conducting state. During the HIGH state of control signal A, such as during time interval 110 of period 107, IGBT 30 is in the nonconducting state.

Waveforms 104 and 106 represent signals $i_{A1}$ and $i_{A2}$ during a single cycle of the AC output current of phase-leg 14, where the output current is sinusoidal. When command signal A is in its LOW state, such as during time interval 108, synthesized signal $i_{A2}$ tracks phase-leg feedback signal $i_{A1}$ to provide the first portion 109 of the conditioned signal. When control signal A is in its HIGH state, such as during time interval 110, phase-leg feedback signal $i_{A1}$ is zero. However, synthesized signal $i_{A2}$ is of equal amplitude to signal $i_{A1}$ at the instant when control signal A changes to its HIGH state, and constitutes the second portion 111 of the synthesized signal; that is, during time interval 110, amplitude of the second portion 111 of synthesized signal $i_{A2}$ corresponds to point 112 on waveform 104. The combination of synthesized signal portions 109 and 111 is representative of total current $i_A$ between phase-leg 14 and the respective winding of the motor delivered at terminal 20 during period 107 of control signal A.

It should be understood that the waveforms shown in FIG. 3 are idealized, since their primary purpose is to illustrate the phase relationship between signal A and each of signals $i_{A1}$ and $i_{A2}$. Further, while the waveforms described above apply to operation of phase-leg 14 of the inverter shown in FIG. 1, the circuits of phase-legs 16 and 18 are substantially identical in configuration and operation to the circuit of phase-leg 14 described above.

Figure 4:
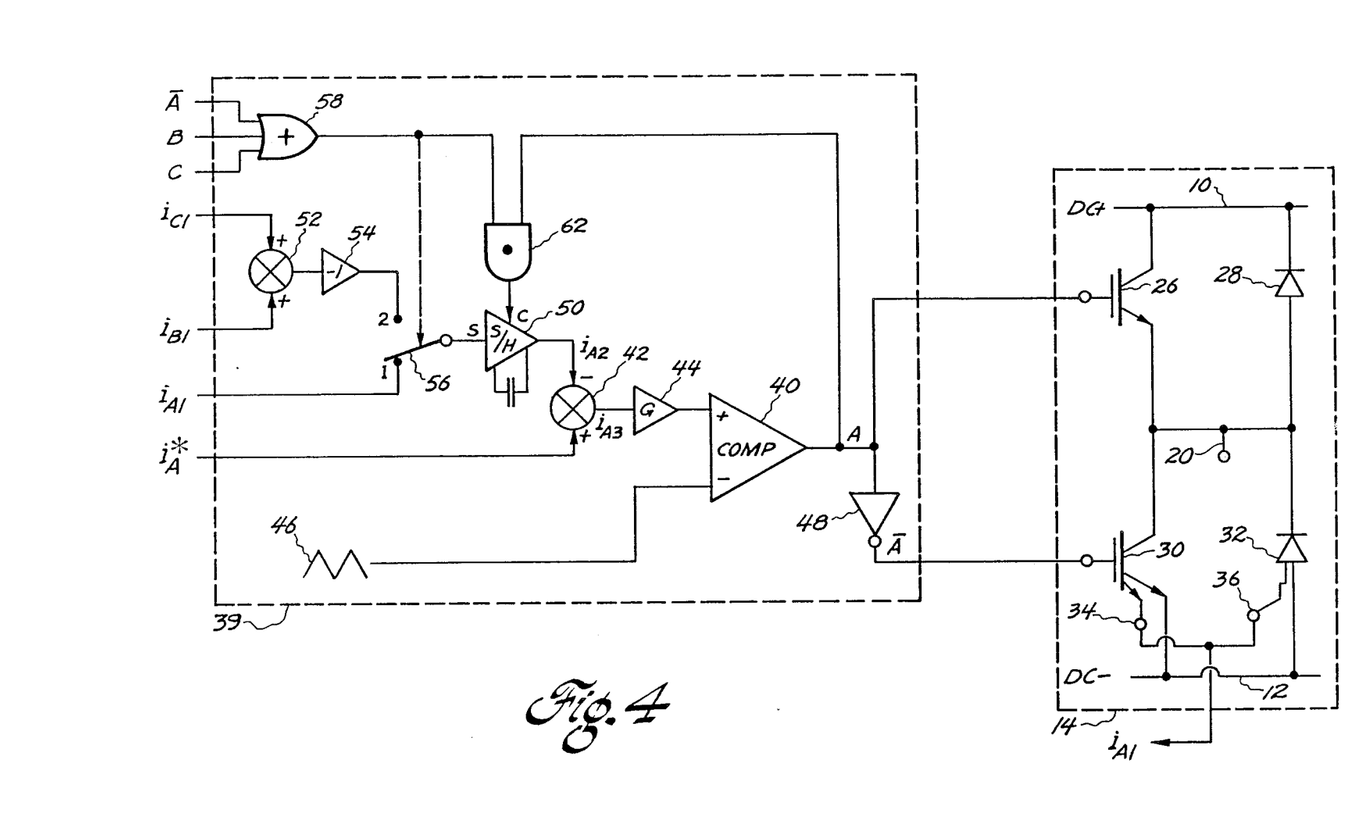
FIG. 4 is a schematic diagram of another embodiment of the present invention applicable to an inverter which supplies current to a three-phase wye-connected load having a floating neutral.

FIG. 4 illustrates an alternative embodiment of the invention applicable to a DC-to-AC inverter applying current to a three-phase wye-connected load having a floating neutral, wherein the sum of the three load phase currents is zero. For simplicity of description, only phase-leg 14 of the inverter described in FIG. 1 and controller 39 connected thereto, are shown in FIG. 4. Current controller 39 includes subtracting means 42, amplifier 44, comparator 40, NOT gate 48 and S/H unit 50, all substantially identical to the like-designated units discussed above in connection with FIG. 2.

Current controller 39 additionally includes summing means 52 connected to receive phase-leg feedback signals $i_{B1}$ and $i_{C1}$ from phase-legs 16 and 18, respectively, an inverting linear amplifier 54 connected to receive the output signal from summing means 52, and a switch 56 connected to receive as an input either the output signal of inverting amplifier 54 or phase-leg feedback signal $i_{A1}$ from phase-leg 14, converted into a proportional voltage by current-to-voltage conversion circuitry (not shown, for simplicity of illustration). An OR gate 58 is connected to receive at its inputs a pair of first binary control signals B and C from phase-legs 16 and 18, respectively, and second control signal $\bar{A}$ which corresponds to the logically inverted output signal of comparator 40. The position of switch 56 is controlled by the output signal of OR gate 58. An AND gate 62 is connected to receive as input signals the output signal of OR gate 58 and the output signal of comparator 40. S/H unit 50 receives its input signals from switch 56 and its control information from AND gate 62. It will be understood that a controller of similar configuration to controller 39 is connected to each of phase-legs 16 and 18 (not shown), respectively.

In the system shown in FIG. 4, the operation of comparator 40, subtracting means 42, amplifier 44, NOT gate 48, and phase-leg 14, as well as phase-legs 16 and 18 which are not shown, is substantially the same as discussed in connection with FIG. 2. It will be recognized by those skilled in the art that for a three-phase wye-connected load having a floating neutral, the sum of the three phase currents is zero. Likewise, the sum of the feedback signals from phase-legs 14, 16 and 18 should also be zero when the associated current sensors are active. Therefore, when phase-leg feedback signals $i_{B1}$ and $i_{C1}$ are providing valid current information for phase-legs 16 and 18, respectively, the feedback signal for phase-leg 14 can be calculated to be $-(i_{B1}+i_{C1})$ which is equal to $i_{A1}$. Thus, the inverted sum of $i_{B1}$ and $i_{C1}$ provides a valid measurement of $i_{A1}$ even when IGBT 30 is nonconductive.

Summing means 52 adds the phase-leg feedback signals $i_{B1}$ and $i_{C1}$ from phase-legs 16 and 18, respectively, and the output signal is applied to inverting amplifier 54 to produce a resultant signal equal to $-(i_{B1}+i_{C1})$. Switch 56 is connected to provide phase-leg feedback signal $i_{A1}$ to S/H unit 50 when in the first switch position and to provide the aforesaid resultant signal $-(i_{B1}+i_{C1})$ to S/H unit 50 when in the second position.

OR gate 58 receives the first binary control signals B and C from the current controllers operating phase-legs 16 and 18, respectively, and also the second binary control signal $\overline{A}$, i.e. the logically inverted command signal A, from NOT gate 48. OR gate 58 thus generates a binary command signal at its output with a LOW state when control signals $\overline{A}$, B, and C are all LOW, and a HIGH state otherwise. In Boolean algebra, the binary output signal from OR gate 58 is expressed as $\overline{A}+B+C$.

Switch 56 is responsive to the OR gate 58 output signal. When the OR gate output signal is HIGH, switch 56 is electronically or electromechanically switched into its first position 1, so that phase-leg feedback signal $i_{A1}$ is supplied to S/H unit 50. When the OR gate output signal is LOW, switch 56 is actuated to its second position 2, so that resultant signal $-(i_{B1}+i_{C1})$ is supplied from inverting amplifier 54 to S/H unit 50. AND gate 62 receives the binary output signal of OR gate 58, as well as first binary control signal A from comparator 40. Thus, the control terminal of S/H unit 50 receives a HIGH control state signal when both AND gate input signals are HIGH, and a LOW control state signal when either or both input signals to AND gate 62 are LOW. In Boolean algebra, the binary output signal of AND gate 62 is expressed as $A(B+C)$.

The input signal received by S/H unit 50 from switch 56 is supplied to subtracting means 42 whenever a LOW state is applied to the S/H unit control terminal, thus generating the first signal portion of the synthesized signal. Whenever a HIGH state is applied to the S/H unit control terminal, the output signal of S/H unit 50 is held constant at the last received input signal value prior to the instant when the control signal state changed from LOW to HIGH, thereby generating the second signal portion of the synthesized signal. Thus the output signal $i_{A2}$ waveform of S/H unit 50 approximates a continuous current feedback signal for comparison with externally derived command signal $i^*_A$.

Operation of the system of FIG. 4 may therefore be summarized as having three possible conditions of operation:

I. When IGBT 30 is conducting, phase-leg feedback signal $i_{A1}$ is supplied to subtracting means 42.

II. When IGBT 30 is nonconducting and the lower IGBTs of phase-legs 16 and 18 are both conducting, the feedback signal supplied to subtracting means 42 is $-(i_{B1}+i_{C1})$.

III. Whenever neither of conditions I or II is applicable, amplitude of the signal applied to subtracting means 42 from S/H unit 50 is held constant at its most recent value determined upon initiation of this condition III.

The preceding is a description of a new and improved method and apparatus for operating a current-controlled PWM inverter where complete feedback information for ech phase is not continuously available. Partial feedback information obtained from current sensors integral with the inverter phase-leg lower switches and diodes is used to regulate operation of the inverter, thereby avoiding signal conditioning difficulties that might otherwise occur in extracting current feedback data from the inverter phase-leg upper switches.

Although the invention has been described in conjunction with inverter configurations where current sensors are integrated into the lower switches and diodes, the upper DC bus being positive and the lower bus negative, the invention is equally applicable in the instance where the upper DC bus is negative and the lower bus positive provided that polarities of all the diodes are reversed. In this latter instance, the inverter can be fabricated using p-channel IGBTs instead of the n-channel IGBTs shown in FIG. 1 so that the integrated current sensors in the phase-leg switches and diodes all provide current feedback signals referred to the positive DC power bus. By using the positive DC bus as the reference point in all phases, common mode level-shifting complications are avoided in the same manner as in FIG. 1.

Those skilled in the art will recognize that the invention is not limited to the specific embodiments described and illustrated. For example, although current controllers for AC synchronous motor drives or induction motor drives have been specifically discussed, the invention is also applicable to current controllers for operating switched reluctance motors or other types of polyphase loads. Additionally, while each of the systems described above receives feedback signals from current sensors integral with the inverter phase-leg lower switches and diodes, the invention is not limited to the specific nature of the current sensors, provided only that the sensors deliver bipolar current data for the lower phase-leg switches and diodes. Although the invention described herein uses IGBTs with integral current sensors, it will be understood that any other type of power semiconductor (e.g., power MOSFET) fabricated with an integral linear current sensor might be used in place of the insulated gate bipolar transistors. Other variations, changes, substitutions and equivalents are possible without departing from the spirit and scope of the present invention. Accordingly, it is intended that the invention to be secured by Letters Patent be limited only by the scope of the appended claims.

What is claimed is:

1. Apparatus for supplying a regulated AC current to a polyphase load, comprising:

an inverter including a pair of DC buses of opposite polarities, said inverter further comprising a phase-leg corresponding to each load phase, respectively, to provide a separate phase, respectively, of said regulated AC current to said load, each of said phase-legs including an upper switch and an upper flyback diode respectively coupled between a DC bus of one polarity and said load, and a lower switch and a lower flyback diode respectively coupled between a DC bus of opposite polarity and said load;

sensing means in each respective phase-leg for sensing current in said lower switch and said lower flyback diode and for providing a phase-leg feedback signal responsive to the sensed current and referred to the said coupled DC bus;

a current controller corresponding to each of said phase-legs, respectively, each said controller including means for generating first and second binary control signals logically inverted with respect to each other, said control signals changing binary states at a variable frequency determined by instantaneous operating conditions, and means for applying said first and second binary control signals to said upper and lower switches, respectively, of the corresponding phase-leg, respectively, to toggle said switches on and off at the frequency of said control signals said current controller further including a circuit responsive to at least said phase-leg feedback signal and said first binary control signal to provide a synthesized signal representative, in each period of said first binary control signal, of total current in the corresponding phase-leg during said period; and means for applying an analog command signal, respectively, to each said current controller, each said controller further including circuit means responsive to said synthesized signal and the respective applied command signal for providing said binary control signals.

2. The apparatus of claim 1 wherein said sensing means in each respective phase-leg comprises:
first and second current sensors integral with said lower switch and said lower flyback diode, respectively, and responsive to current in said lower switch and lower diode, respectively, to provide proportional sensor currents referred to the said coupled DC power bus; and
means coupled to said current sensors for deriving a phase-leg feedback signal from said sensor currents.

3. The apparatus of claim 1 wherein said circuit means comprises:
means for subtracting said synthesized signal from said command signal to provide a current error signal; and
a comparator for comparing said current error signal with a reference waveform of predetermined amplitude and frequency to provide said first binary control signal.

4. The apparatus of claim 3 wherein said current controller further includes a NOT gate responsive to said first binary control signal to provide said second binary control signal.

5. The apparatus of claim 1 wherein said synthesized signal comprises first and second signal portions occurring successively during each period of said first binary control signal, and wherein said circuit providing said synthesized signal comprises:
a sample-and-hold unit responsive to LOW and HIGH states of said first binary control signal to provide said first and second signal portions, respectively, said first signal portion being substantially identical to said phase-leg feedback signal within said each period, and said second signal portion having a constant amplitude substantially equal to amplitude of the first signal portion within said each period at the instant said first control signal changes from its LOW state to its HIGH state, indicating that a valid current feedback signal is not available.

6. The apparatus of claim 1 wherein, in said each controller, said circuit providing said synthesized signal comprises:
an OR gate coupled to receive said second binary control signal, said OR gate being further coupled to each of the remaining current controllers corresponding to the remaining phase-legs of said inverter, respectively, to receive therefrom, respectively, a separate first binary control signal;
an AND gate having one input coupled to the output of said OR gate and another input coupled to receive said first binary control signal;
means for summing the phase-leg feedback signals separately derived from each of said remaining phase-legs, respectively, to provide a resultant signal;
switching means responsive to the output signal of said OR gate for selectively receiving either said resultant signal or said first-recited phase-leg feedback signal; and a sample-and-hold unit responsive to LOW and HIGH states at the output of said AND gate to provide first and second portions, respectively, of said synthesized signal, said first synthesized signal portion being substantially identical to said first-recited phase-leg feedback signal within said each period, and said second synthesized signal portion having a constant amplitude substantially equal to amplitude of said first synthesized signal portion within said each period at the instant when said AND gate output signal state changes from LOW to HIGH, indicating that a valid current feedback signal is not available.

7. The apparatus of claim 6 including, in said each controller, respectively, means for inverting polarity of the output signal produced by said summing means so as to provide said resultant signal.

8. A method for operating a current-controlled PWM inverter in accordance with an externally derived analog command signal to supply a regulated AC current to a polyphase load, said inverter including a pair of positive and negative DC input buses, a phase-leg, respectively, corresponding to each load phase, respectively, to provide one phase of said regulated current to said load, each of said phase-legs including an upper switch and an upper flyback diode respectively coupled between said one of said DC input buses and said load, and a lower switch and a lower flyback diode respectively coupled between the other of said DC input buses and said load, said method comprising, for each of said phase-legs, the steps of:
applying, to said upper and lower switches, respectively, first and second binary control signals logically inverted with respect to each other, said control signals changing binary states at a variable frequency determined by instantaneous operating conditions and toggling said switches on and off at the frequency of said control signals;
generating a phase-leg feedback signal proportional to the combined sensed current in said lower switch and said lower flyback diode when said lower switch is conductive;
generating, within a first time interval, a first portion of a synthesized signal substantially identical to said phase-leg feedback signal whenever said first binary control signal is in a LOW state, corresponding to the time interval when a valid current feedback signal is available;
generating, within a second time interval, a second portion of said synthesized signal whenever said first binary control signal is in a HIGH state, indicating that a valid current feedback signal is not available, said second portion of said synthesized signal having a constant amplitude substantially equal to the amplitude of said first portion of said synthesized signal immediately prior to the change in said first binary control signal from its LOW state to its HIGH state; and
subtracting said synthesized signal from said analog command signal to provide a current error signal;
whereby said first binary control signal is generated by comparing said current error signal with an externally derived reference waveform of predetermined amplitude and frequency and said second binary control signal is generated by logically inverting said first binary control signal.

9. The method of claim 8 wherein the step of generating a phase-leg feedback signal includes the step of sensing current in each of said lower switch and said lower flyback diode.

10. The method of claim 8 wherein said reference waveform consists of bipolar triangular pulses.

11. The method of claim 8 wherein said first and second time intervals occur successively.

12. A method for operating a current-controlled PWM inverter in accordance with an externally derived analog signal to supply a regulated AC current to a wye-connected polyphase load having a floating neutral, said inverter including a pair of positive and negative DC input buses, a phase-leg, respectively, corresponding to each load phase, respectively, to provide one phase of said regulated current to said load, each of said phase-legs including an upper switch and an upper flyback diode respectively coupled between said one of said DC input buses and said load, and a lower switch and a lower flyback diode respectively coupled between the other of said DC input buses and said load, said method comprising, for each of said phase-legs, the steps of:

applying to said upper and lower switches, respectively, first and second binary control signals logically inverted with respect to each other, said control signals changing binary states at a variable frequency determined by instantaneous operating conditions and toggling said switches on and off at the frequency of said control signals;

generating a phase-leg feedback signal proportional to the combined sensed current in said lower switch and said lower flyback diode when said lower switch is conductive;

OR gating said second binary control signal corresponding to a designated phase-leg with first binary control signals separately derived from each of the remaining phase-legs to produce an OR-gated output signal;

AND gating the OR-gated output signal with said first binary control signal derived from said designated phase-leg to produce an AND-gated output signal;

summing the phase-leg feedback signals separately derived from said remaining phase-legs to provide a resultant signal;

generating a switch output signal equal to said phase-leg feedback signal from said corresponding phase-leg, or to said resultant signal, in accordance with whether the OR-gated output signal is HIGH or LOW respectively;

generating a synthesized signal from said resultant signal, said synthesized signal having a first portion or a second portion whenever the AND-gated output signal is LOW or HIGH respectively, said first portion of said synthesized signal being substantially equal to said last-received phase-leg feedback signal, and said second portion of said synthesized signal having a constant amplitude substantially equal to the amplitude of said first portion immediately prior to the change in AND-gated output signal from LOW to HIGH; and subtracting said synthesized signal from said command signal to provide a current error signal;

whereby said first binary control signal is generated by comparing said current error signal with an externally derived reference waveform of predetermined amplitude and frequency and said second binary control signal is generated by logically inverting said first binary control signal.

13. The method of claim 12 wherein the step of summing the phase-leg feedback signals includes the step of inverting the polarity of the summed signals to provide said resultant signal.

14. The method of claim 12 wherein said reference waveform consists of bipolar triangular pulses.

15. The method of claim 12 wherein the step of generating a phase-leg feedback signal includes the step of sensing current in each of said lower switch and said lower flyback diode.

* * * * *